(12) United States Patent
Pelloie et al.

(10) Patent No.: US 8,219,950 B2
(45) Date of Patent: Jul. 10, 2012

(54) PROPAGATION DELAY TIME BALANCING IN CHAINED INVERTING DEVICES

(75) Inventors: Jean-Luc Pelloie, Moirans (FR); Yves Thomas Laplanche, Crolles (FR)

(73) Assignee: ARM Limited, Cambridge (GB)

( * ) Notice: Subject to any disclaimer, the term of this patent is extended or adjusted under 35 U.S.C. 154(b) by 599 days.

(21) Appl. No.: 12/382,689

(22) Filed: Mar. 20, 2009

(65) Prior Publication Data

US 2010/0242010 A1    Sep. 23, 2010

(51) Int. Cl.
*G06F 17/50* (2006.01)
(52) U.S. Cl. ....................................................... 716/110
(58) Field of Classification Search .......... 327/170–176; 716/100
See application file for complete search history.

(56) References Cited

U.S. PATENT DOCUMENTS

| | | | |
|---|---|---|---|
| 2002/0109192 A1* | 8/2002 | Hogyoku | 257/365 |
| 2004/0024554 A1* | 2/2004 | Jung et al. | 702/107 |
| 2007/0252628 A1* | 11/2007 | Abe | 327/172 |

* cited by examiner

*Primary Examiner* — Vuthe Siek
*Assistant Examiner* — Aric Lin
(74) *Attorney, Agent, or Firm* — Nixon & Vanderhye P.C.

(57) ABSTRACT

A circuit comprising a plurality of semiconductor inverting devices arranged in series is disclosed. Each of the semiconductor inverting devices comprise at least one NMOS transistor and at least one PMOS transistor and alternate ones of the inverting devices in the series comprise transistors having a first ratio of a width of the at least one PMOS transistor and the at least one NMOS transistor; and alternate ones of said inverting devices in the series comprise transistors having a second ratio of a width of the at least one PMOS transistor and the at least one NMOS transistor; wherein the first ratio and the second ratio are not equal and in some case, the first and second ratios are such that a sum of a delay in a rise time of a signal propagated by a first inverting device and a fall time of a signal propagated by a second inverting device is substantially equal to a delay in a fall time of a signal propagated by the first inverting device.

17 Claims, 7 Drawing Sheets

---

Determine semiconductor device required to perform logical function of cell, the semiconductor device comprising at least one NMOS transistor and at least one PMOS transistor

↓

Determine rise and fall propagation delay times for two cells one with a one at input in inactive state and one with a zero at input in inactive state

↓

Change ratio of widths of PMOS transistor(s) and NMOS transistor(s) forming the semiconductor device of the two cells in order to reduce a difference in the sum of rise time of the first cell and fall time of the second cell and the sum of fall time of the first cell and rise time of the second cell, of a signal propagated by the two cells and following an inactive period during which they did not change state

↓

Determine ratio that provides minimum difference in the sum

↓

Select ratio of widths corresponding to the minimum

↓ design two cells having the selected ratios of widths

PROPAGATION DELAY TIME BALANCING IN CHAINED INVERTING DEVICES

BACKGROUND OF THE INVENTION

1. Field of the Invention

The field of the invention relates to semiconductor devices and in particular to inverting semiconductor devices made from partially depleted silicon on insulator (SOI).

2. Description of the Prior Art

Cell libraries are known in which cells that fit onto a standard grid are designed for performing particular logical functions. Circuits can then be designed using these standard cells.

When selecting a cell to use, such things as propagation time, required drive strength and capacitance are considered. Propagation time of a signal through a device depends on a sum of the rise time and fall time of that signal. The rise and fall time for a device may be different and depends on the ratio of the width of the NMOS and PMOS transistors forming the device. The width of a transistor is the width of its active region (Wp for the PMOS transistor 10 and Wn for the NMOS transistor 20 in FIG. 1). These widths can be varied to provide either an average delay time that is a minimum of the sum of the rise and fall time or a balanced delay time, in which the rise time equals the fall time. Standard cells may be made available that provide either a lowest average delay time or a balanced delay time.

In standard cells made using bulk processes the initial or DC state of the device prior to it switching will not affect the delay times. However, in devices formed using other processes such as, partially depleted silicon on insulator techniques the propagation delay for rise and fall time may depend on the state of the device when it is inactive prior to it switching. This is because unlike bulk devices where the well of the device is tied to a set voltage, in SOI devices, for example, the "well" of the device is isolated and has a floating potential.

FIG. 1 shows an inverter in transistor and layout form. When a 0 is received at the input the output outputs a 1, and thus, in a transistor formed using partially depleted SOI techniques the "well" of transistor 10 (in this embodiment a PMOS device) is floating between a 1 at the output and a 1 at the high power rail and is thus, at about 1. The "well" of transistor 20 (in this embodiment an NMOS device), however lies between the output 1 and 0, and in this case floats at about 0.3. When a 1 is received at the input there is a 0 at the output and the "well" of transistor 10 floats between 1 and 0 at the output and lies at about 0.7 (1-0.3), while the well of transistor 20 lies between two 0s and therefore floats at about 0. Thus, in the DC or inactive state when the devices are not switching they are not symmetrical and this affects their rise and fall times when they start to switch.

FIG. 2 shows a diagram illustrating different rise and fall times of these devices with DC0 indicating the device having a 0 at its input in the inactive or DC state and DC1 indicating the device having a 1 at its input in the inactive or DC state. Looking at FIG. 2 it becomes clear that setting a ratio of transistors to produce a balanced rise and fall delay propagation time following an inactive state is no longer straightforward as these delays depend on initial state.

However, if these propagation delays are not balanced then problems can result. The difference in propagation delays is termed the history effect and it results in a stretching of a portion of the switching signal when it passes through two inverters and results in the signal no longer being symmetrical. In the SOI partially depleted technology the history effect due to the change in behaviour of the transistors depending on previous switches is particularly marked. Many devices are made from inverting devices arranged in series, and thus, this problem is widespread.

FIG. 3 shows the stretching effect on a symmetric input signal propagated by two inverters formed from partially depleted SOI processes following an inactive state. As there are two inverters arranged in series, they each necessarily have different inputs in all states including an inactive state. Thus, following an inactive state they will have different rise and fall propagation times. This generates a stretching effect when stimulating the path with a symmetric signal (i.e. the high state duration equals the low state duration). The amount of this stretching effect can be calculated by analysing the propagation time on each port. Let's consider a chain of 2N inverters stimulated by a signal starting with a low state (DC0). The odd cells start operating with a DC0 state and the even cells with a DC1 state. As a consequence the propagation delay of the first switch through the cell is $t_{first} = N \cdot (t_{rise}^{DC0} + t_{fall}^{DC1})$ whereas the second switch is $t_{second} = N \cdot (t_{fall}^{DC0} + t_{rise}^{DC1})$. The stretching effect is given by the difference of both propagation delays which is directly linked to the History Effect as $t_{rise}^{DC0}$ is not equal to $t_{rise}^{DC1}$ and $t_{fall}^{DC0}$ is not equal to $t_{fall}^{DC1}$. Note that for bulk technologies there is no stretching effect as the rise and fall delays have a unique value but still a stretching effect may be observed due to local variations. For SOI both the history effect and local variations contribute to signal stretching.

The stretching effect has a detrimental effect on the clock tree as the symmetry of the clock signal is not controlled anymore.

As noted above these problems generally do not occur in bulk devices and nor do they occur in SOI partially-depleted devices operating at a steady state. However, in modern low power systems, clock gating occurs periodically and takes the system back to DC states, thus the non-symmetry effects described above become important.

SUMMARY OF THE INVENTION

A first aspect of the present invention provides a set of two cells for performing a same logical function, each of said two cells comprising a semiconductor inverting device, said semiconductor inverting device comprising at least one NMOS transistor and at least one PMOS transistor; a first of said two cells configured to operate with an input of zero during an inactive period where said cell does not change state; a second of said two cells configured to operate with an input of one during an inactive period where said cell does not change state; said first cell having a first ratio of a width of said at least one PMOS transistor and said at least one NMOS transistor within said semiconductor inverting device; and said second cell having a second ratio of a width of said at least one PMOS transistor and said at least one NMOS transistor within said semiconductor inverting device; wherein said first ratio is not equal to said second ratio and said first and second ratios are such that a sum of a delay in a rise time of a signal propagated by said first cell and a fall time of a signal propagated by said second cell is substantially equal to a delay in a fall time of a signal propagated by said first cell and a rise time of a signal propagated by said second cell, even when said signal is propagated directly after said inactive period.

The present invention recognises that devices that switch state may not have the same rise and fall time delays if their state during an inactive period prior to switching is different. It also recognises that this can cause problems, particularly for inverting devices in series, where it can produce a signal with a duty cycle that is not symmetrical. It addresses this problem by producing two cells each having an inverting device, one that is configured to operate with an input of 0 during an inactive period and one that is configured to operate with an input of 1 during an inactive period. It then designs these cells to have different ratios of widths of the PMOS and NMOS transistors. The ratio of width of the PMOS and NMOS transistors affects the rise time propagation delays and full time propagation delays of the devices.

Thus, by varying these widths in the two cells, cells where the sum of the delay in a rise time of a signal propagated by the first cell and a fall time of a signal propagated by the second cell is substantially equal to a delay in a rise time of a signal propagated by the second cell and a fall time of a signal propagated by the first cell, even when the signal is propagated directly after an inactive period. By setting these delay times equal to each other or at least substantially equal to each other or at least reducing the difference in them by as much as is practically possible a duty cycle for a signal that passes through the two devices that is symmetrical or substantially symmetrical is produced. It should be noted that changing the ratio of the widths need not affect the size of the device provided the sum of the widths stays the same.

In summary, by cleverly choosing the widths of the two devices it is possible to correct for imbalances in the devices due to the differences following DC0 and DC1 inactive states.

It should be noted that most devices are formed from inverting devices that are arranged in series and thus, the problem of an asymmetrical duty cycle being produced from devices arranged in series with different rise and fall propagation times is a common one.

Although, the two cells may be formed using a number of different techniques, in some embodiments they are formed using a partially depleted silicon on insulator process. Partially depleted silicon on insulator process devices suffer in particular from this difference in rise and fall times depending on the initial state and thus, embodiments of the present invention are particularly applicable to these devices.

Cells of embodiments of the present invention can perform a number of logical functions but in some embodiments said cells comprise a single stage inverting cell.

In some embodiments, said logical function performed by said cells is an inverting function.

In some embodiments, said inverting function comprises one of a NAND, NOR, AOI, or OAI.

A simple cell where a problem of differing propagation rise time delays manifests itself is a cell having an inverting function. These cells are often used in series with each other and thus, the initial state of each cell following an inactive period will necessarily be different for alternate cells. Thus, these propagation delay differences will affect the output signal of such an arrangement unless the cells are selected.

In some embodiments, each of said first and second cells comprises at least two inverting semiconductor devices arranged in series; an inverting semiconductor device adjacent to an input in said first cell having said first ratio of widths of transistors, and subsequent inverting semiconductor devices each having alternate second and first ratios of widths of transistors; and an inverting semiconductor device adjacent to an input in said second cell having said second ratio of widths of transistors, and subsequent inverting semiconductor devices arranged in series each having alternate first and second ratios of widths.

Although, in some embodiments the cells are inverting cells, in other embodiments they may be non-inverting cells but comprise two inverting semi-conductor devices arranged in series within them. In such a case, the problem with propagation times may still exist unless the semiconductor devices are arranged with the appropriate widths.

In some embodiments said cells each comprise a dual-stage non-inverting cell comprising a first inverting semiconductor device and a second inverting semiconductor device, said first inverting semiconductor device in said first cell having said first ratio of widths and said second inverting semiconductor device in said first cell having said second ratio of widths, and said first inverting semiconductor device in said second cell having said second ratio of widths and said second inverting semiconductor device in said second cell having said first ratio of widths.

For the non-inverting devices that comprise at least two inverting devices within them, the two cells consist of the inverting devices being arranged in a different order, so that one is suitable for a DC0 state and one a DC1 state.

Although the logical function performed by the cells may comprise a number of things in some embodiments, said logical function performed by said cells comprises at least one of buffer, AND, OR, AO and OA.

Although the cells in a set of two cells may be asynchronous cells that receive input signals that switch state, in some embodiments they comprise synchronous cells and the inactive period is a period during which the cells are not clocked.

A second aspect of the present invention provides a processing apparatus comprising a plurality of cells, said plurality of cells comprising at least one of said set of two cells according to a first aspect of the present invention arranged in series.

The cells of a first aspect of the present invention are designed so that when arranged in series either with themselves if they are non-inverting devices, or with their counterpart from the set if they are inverting devices, they generate a signal with a duty cycle that is symmetrical owing to the design of these cells.

In some embodiments, said processing apparatus further comprises circuitry responsive to a signal indicating a start of an inactive period for said set of cells to supply a zero to said first cell of said set of cells and a one to said second cell of said set of cells.

It may be that additional circuitry is required to ensure that the signal sent to the input of the first cell during an inactive period is a 0 and the signal sent to the input of the second cell during an active period is a 1. As these cells are designed to operate in a certain way following an inactive state with a certain input, it may be necessary to ensure that they do have this input in the inactive state using additional circuitry.

The signal indicating a start of an inactive period may be a number of things, for example it may be a reset signal, a clock gating signal if the cells are synchronous or a power up signal.

A third aspect of the present invention provides a plurality of semiconductor inverting devices arranged in series, each of said semiconductor inverting devices comprising at least one NMOS transistor and at least one PMOS transistor; wherein alternate ones of said inverting devices in said series comprise transistors having a first ratio of a width of said at least one PMOS transistor and said at least one NMOS transistor; and alternate ones of said inverting devices in said series comprise transistors having a second ratio of a width of said at least one PMOS transistor and said at least one NMOS transistor; wherein said first ratio and said second ratio are not equal.

The present invention recognises that in circuits having alternating inverting devices a problem of these devices having different rise and fall time propagation delays may result in an output signal being asymmetrical following an inactive period unless the inverting devices are designed differently depending upon whether the input signal during an inactive period is a 0 or a 1. Thus, in the present invention a circuit is designed in which alternate inverting devices comprise transistors having different ratios of widths for the PMOS and the NMOS transistors. These different widths are designed to compensate for different rise and fall time propagation delays owing to their different input signal during an inactive period.

In some embodiments said first and second ratios are such that a sum of a delay in a rise time of a signal propagated by one of said inverters and a fall time of a signal propagated by an adjacent inverter is substantially equal to a delay in a rise time of a signal propagated by said one of said inverters and a fall time of a signal propagated by said adjacent inverter, even when said signal is propagated after an inactive period during which said inverters do not change state.

In order for the duty cycle of the output signal to be substantially symmetrical in some embodiments the first and second ratios are designed in the above manner.

Although the semiconductor devices may be formed in a number of ways, in some embodiments said semiconductor inverting devices are formed using a partially depleted silicon on insulator process.

Partially depleted silicon on insulator processes provide semiconductor inverting devices whose propagation delay times vary depending on whether there is a 1 or a 0 stored during an inactive period for switches that occur shortly after this inactive period. Thus, for semiconductor inverting devices formed in this way, it is advantageous when they are designed to have different ratios of widths of the PMOS and NMOS transistors to compensate for these differences in propagation delay times.

A fourth aspect of the present invention provides a method of designing a set of two cells for performing a same logical function, each of said two cells comprising a corresponding semiconductor device formed of partially depleted silicon on insulator, said semiconductor device comprising at least one NMOS transistor and at least one PMOS transistor; a first cell being designed to operate with an input of zero during an inactive period during which said cell does not change state; a second cell being designed to operate with an input of one during an inactive period during which said cell does not change state; said method comprising the steps of: determining a ratio of widths of said at least one PMOS transistor and said at least one NMOS transistor within said semiconductor device of said first and second cells that provide a minimum in a difference in the sum of rise time of said first cell and fall time of said second cell and the sum of fall time of said first cell and rise time of said second cell, of a signal propagated by said two cells following an inactive period during which they did not change state; said ratio of widths being different for said two cells and designing said two cells having said determined ratios of widths.

A fifth aspect of the invention provides a method of designing a circuit using cells including said set of two cells according to a first aspect of the present invention, comprising the steps of: determining an arrangement of cells required to perform a desired function; where said cells selected are cells to perform said logical function of said cells according to a first aspect of the present invention, determining an input value to said cell during an inactive period; and selecting said first or said second cell in dependence upon said input value.

The two cells in a set of cells provided by aspects of the present invention allow a circuit to be designed in which these cells process signals and are arranged so that they have a certain input value in the inactive state and thus, any differences in rise and fall time delay propagations are compensated for between the two cells of the set so that the signals retain a symmetrical duty cycle.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
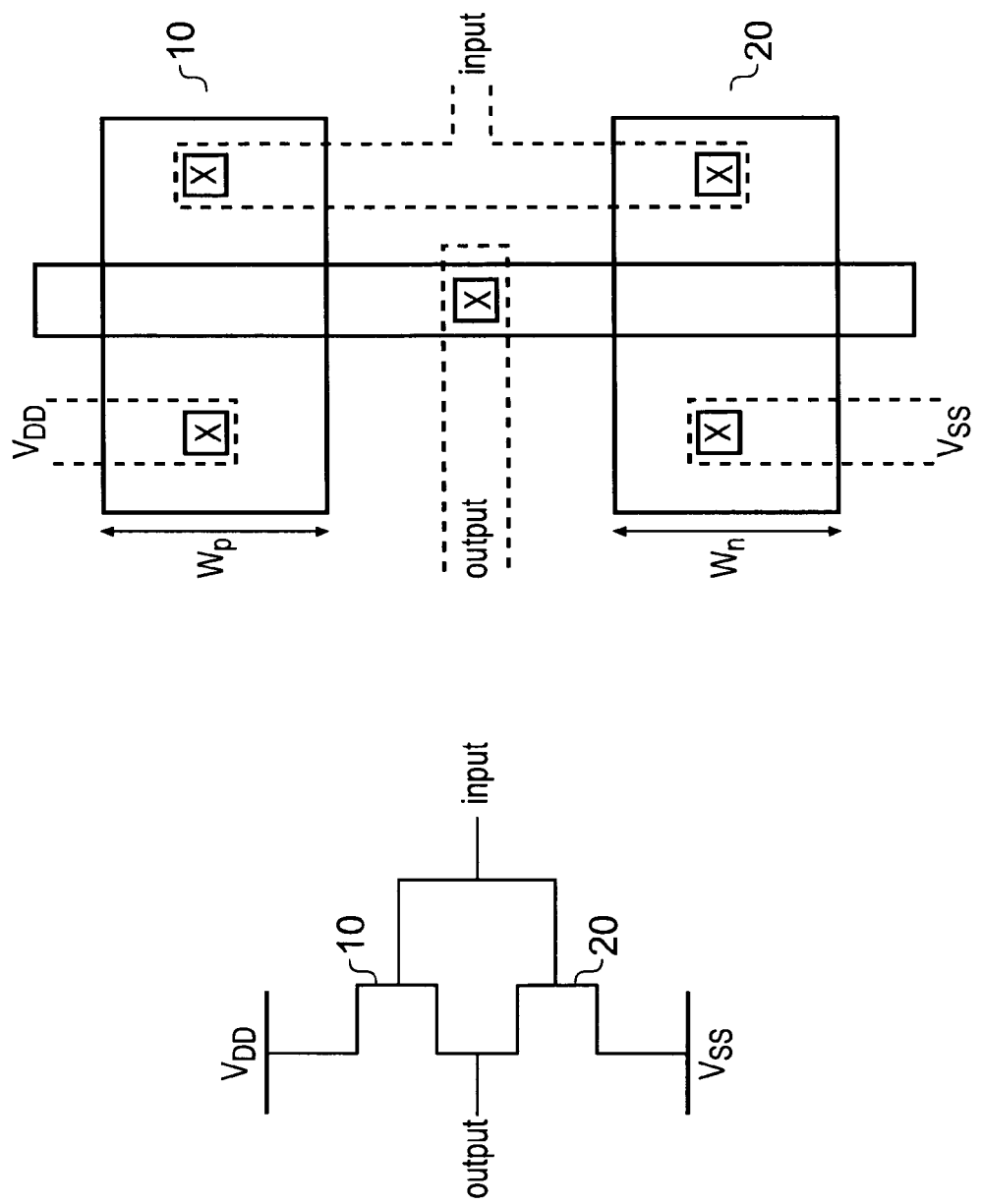
FIG. 1 shows an inverter in circuit and layout form.
Figure 2:
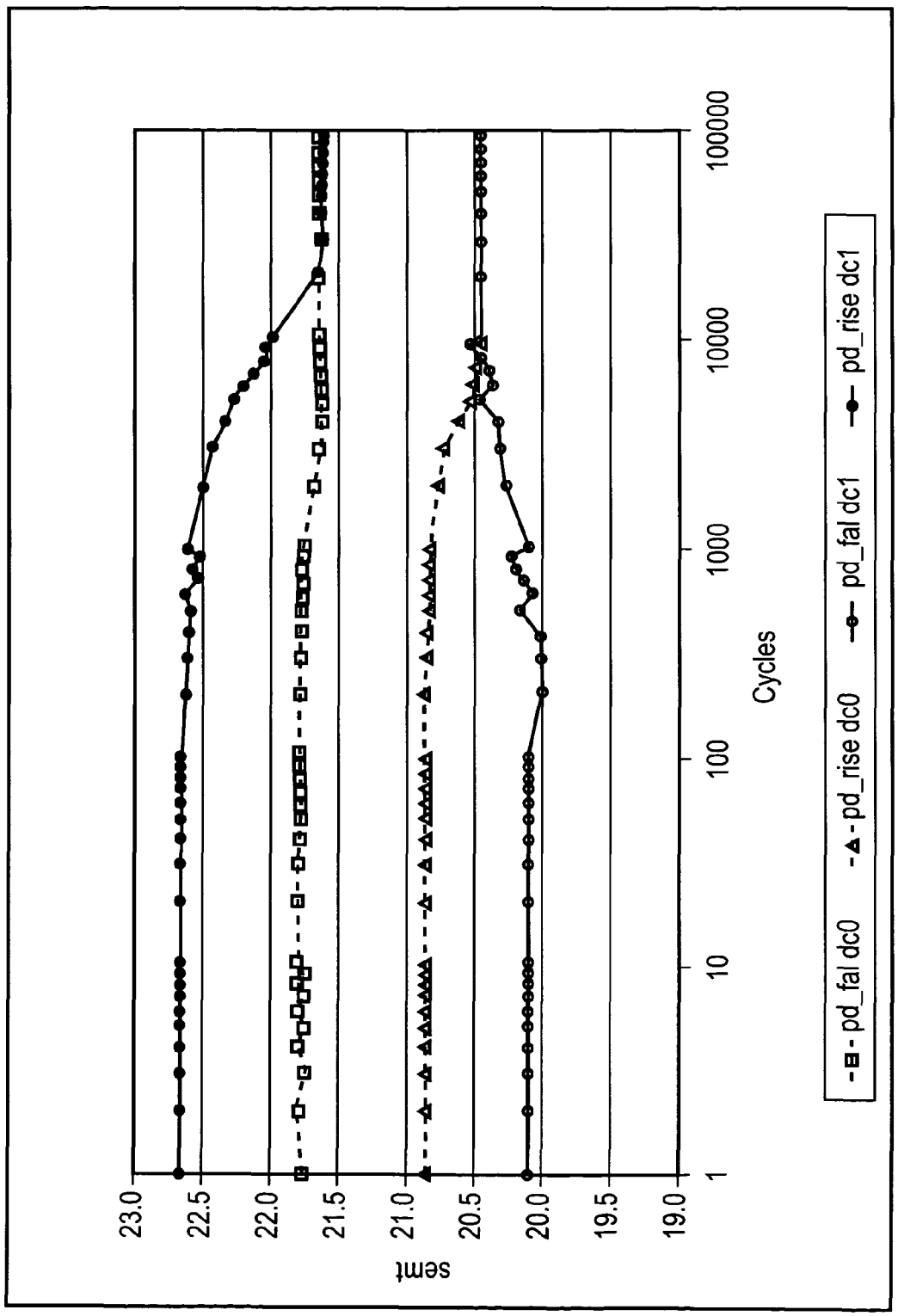
FIG. 2 shows rise and fall time propagation delays with respect to the number of cycles following an inactive period.
Figure 3:
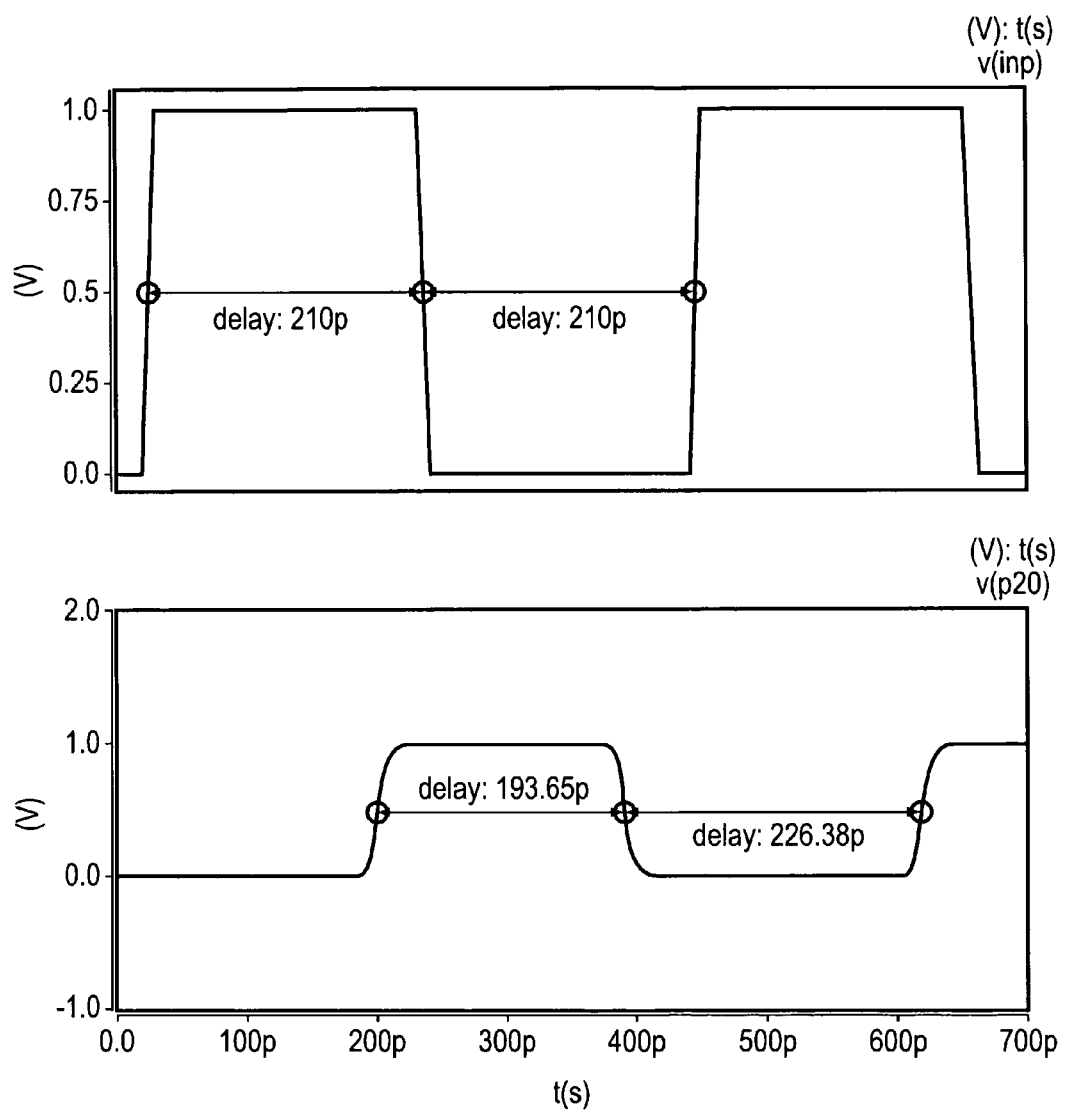
FIG. 3: shows the stretching effect on a signal transmitted by an inverter chain of the prior art.
Figure 4:
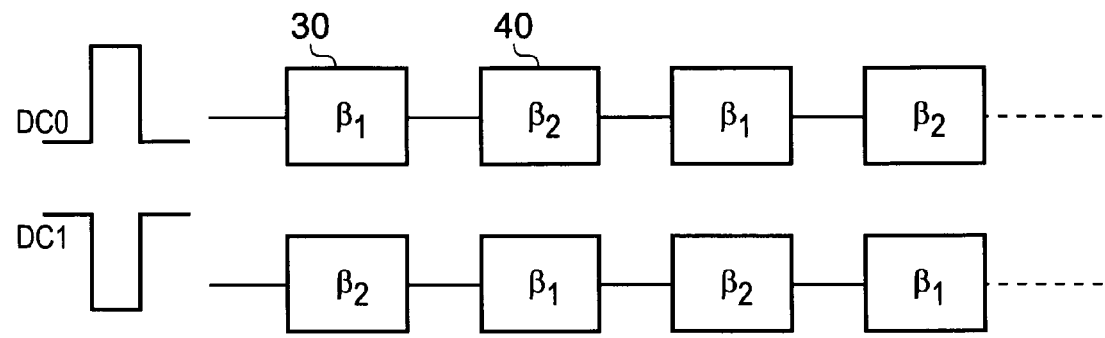
FIG. 4 shows a chain of single stage inverting cells according to an embodiment of the present invention.

FIG. 4 shows a chain of single stage inverting cells according to an embodiment of the present invention. These inverting cells may be simple inverters, they may be NAND gates NOR gates AOI or OAI.

This chain of inverting cells is formed form two different inverting cells, inverting cell 30 which has a ratio of the width of the PMOS devices and the width of the NMOS devices forming this cell WP/WN=β1 and a second inverter device 40 which is formed from PMOS and NMOS devices having a ratio of their widths of β2. Inverting device 30 and inverting device 40 have been designed so that if in an inactive state cell 30 has a 0 at its input and cell 40 a 1 then when a signal is propagated through the cells the sum of the delay in the rise time of cell 30 and fall time of cell 40 is substantially equal to the delay in rise time of cell 40 and fall time of cell 30. This means that the signal propagated will not become asymmetric due to the differences in propagation time.

As can be seen schematically, when cell 30 transmits a rising and then a falling signal cell 40 propagates a falling and then a rising signal. Thus, the delay that cell 30 adds to the rising time of the signal added to the delay that cell 40 adds to the falling time of the signal is the total delay for the rising edge of this signal to propagate through the two devices. Furthermore, the total delay for the second edge of the signal to propagate through the two devices is the falling delay through device 30 and the rising delay through device 40. If these two delay times are equal then the signal keeps its shape.

Thus, in this way two cells are provided that are specially sized to be odd cells and specially sized to be even cells. In this way by cleverly choosing β1 and β2 it is possible to correct for the DC0 (0 input in inactive state) and DC1 (1 input in inactive state) imbalance in the chain. Thus, when designing a circuit the designer can now assess the relative importance of the DC effect on the cells and where the propagation delay times are important, cells with different β ratios may be picked from the library and in this way the clock tree can be improved.

Thus, two cells are provided in the library, one for use as an even cell and one as an odd cell in an inverting chain and the duty cycle for the device is then kept substantially symmetrical.

FIG. 4 shows very simple single stage inverter devices. It should be understood that this problem arises in inverting devices, but that many devices are formed from different inverting stages and thus, this problem will arise in these devices too and can be addressed in the same way.

Figure 5:
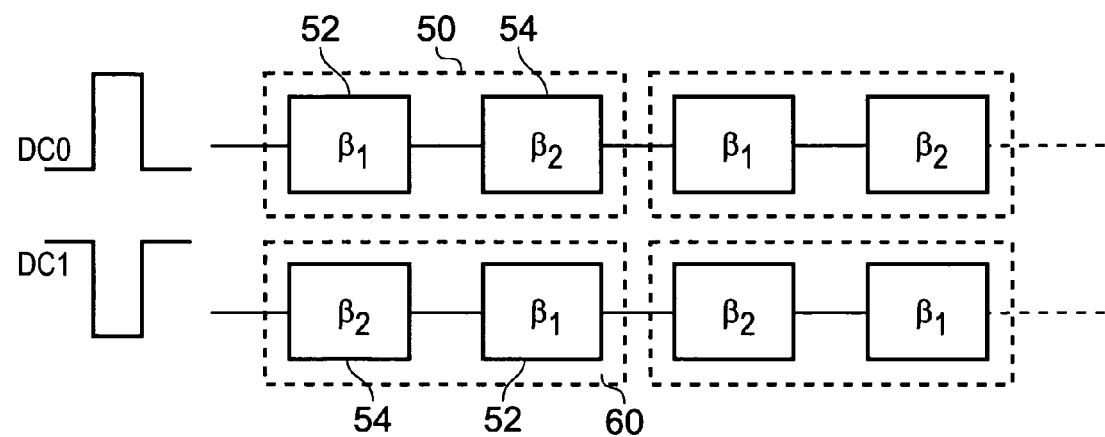
FIG. 5 shows two chains of dual-stage non-inverting cells according to an embodiment of the present invention.

FIG. 5 shows dual stage non-inverting cells according to an embodiment of the present invention.

Cell 50 has been designed to operate whilst receiving a 0 in its inactive state while cell 60 has been designed to receive a 1 during its inactive state. It should be noted that when these devices are chained then a chain of the same devices are used as the cell does not invert the signal and thus, the input is equal to the output and thus, if a cell that receives a 0 in an inactive state is required the cell following it in the chain will be the same cell.

These cells are formed of two devices, cell 50 is formed of a first inverting device 52 and a second inverting device 54. The first inverting device 52 receives the input signal to the cell and thus, is designed with the idea that in the inactive state it will receive a 0. If inverting device 52 receives and stores a 0 in the inactive state then inverting device 54 will receive and store a 1 as its input is linked to the output of inverting device 52. Thus, the ratio of widths of the NMOS and PMOS transistors forming these devices are set in a similar way to the inverting chains of FIG. 4 so that the sum of the rise time of device 52 and the fall time of device 54 is equal to the sum of the fall time of device 52 and the sum of the rise time of device 54. In this way a signal propagated by cell 50 keeps its shape.

Cell 60 is designed to receive a 1 at its input in the inactive state and as such is formed for device 54 followed by device 52.

In this way two cells are provided for the library, cell 50 and cell 60 and they are selected depending upon whether or not in an inactive state the input to the device would hold a 0 or a 1.

Figure 6:
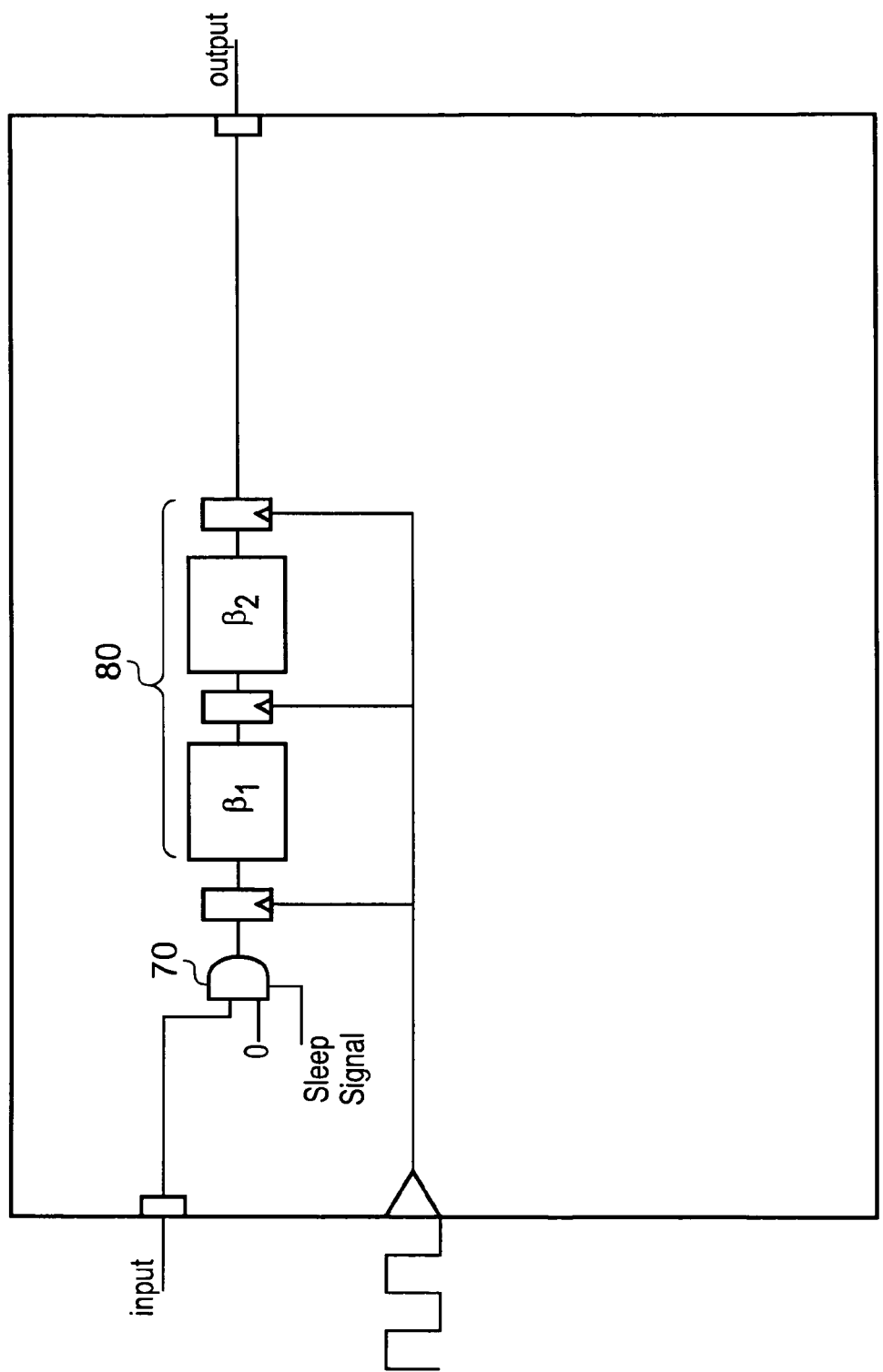
FIG. 6 shows a data processing apparatus according to an embodiment of the present invention.

It should be noted that in some circuits the input to the cells may not be determined in an inactive state. In such cases, additional circuitry may be used. In the synchronous apparatus of FIG. 6, a multiplexer 70 is used to set the input to an inverter chain 80 in the inactive state. In response to a sleep signal indicating that the clock signal will be turned off, the multiplexer selects a 0 and in responsive to no sleep signal it selects the input signal. Thus, when the clock signal is on, the input signal is input to the inverter chain, while when the clock signal is off, a 0 is input to the inverter chain.

Figure 7:
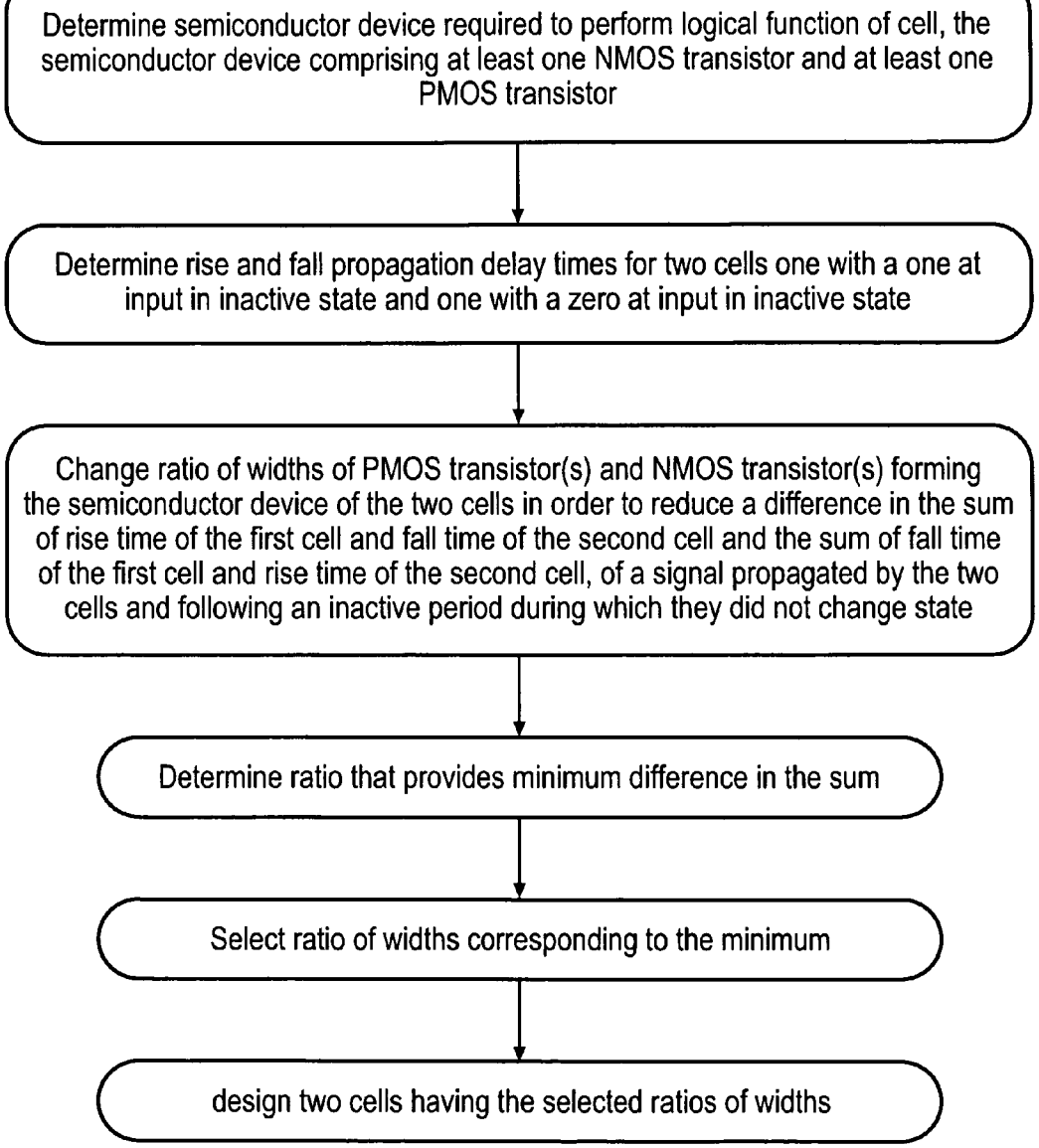
FIG. 7 shows a flow diagram illustrating a method of designing a set of cells according to an embodiment of the present invention.

FIG. 7 shows a flow diagram illustrating a method of defining a set of cells according to an embodiment of the present invention. When designing standard cells, firstly the logical function of the cell is considered and the appropriate semiconductor devices are arranged to provide this function. These generally consist of NMOS and PMOS transistors.

In this method, the rise and fall propagation delay times for a cell formed in this way are also determined. Given that in this embodiment the transistors are formed using partially depleted SOI techniques, the rise and fall propagation delay times are determined for two cells that perform the same logical function, the one cell having a 1 at its input in the inactive state and the other a 0 at its input in the inactive state. The rise and fall propagation delay times are determined for a signal sent after an inactive state.

The ratio of widths of the PMOS transistors and the NMOS transistors forming the semiconductor device of the two cells are then changed to reduce the difference in the sum of the rise time of the first cell and the fall time of the second cell and the sum of the fall time of the first cell and the rise time of the second cell of the signal propagated by the two cells following an inactive period.

Ratios that give a minimum difference in the sum are then determined and these are the ratios of the widths that are chosen when designing the cell.

In this way, two standard cells are designed that perform the same logical function and have the same devices within them. However, these devices are sized differently so that when arranged in series the signal that they send will not be stretched but will keep its shape. Thus, the cells are selected to optimise or at least improve the symmetry of the signal transmitted.

Figure 8:
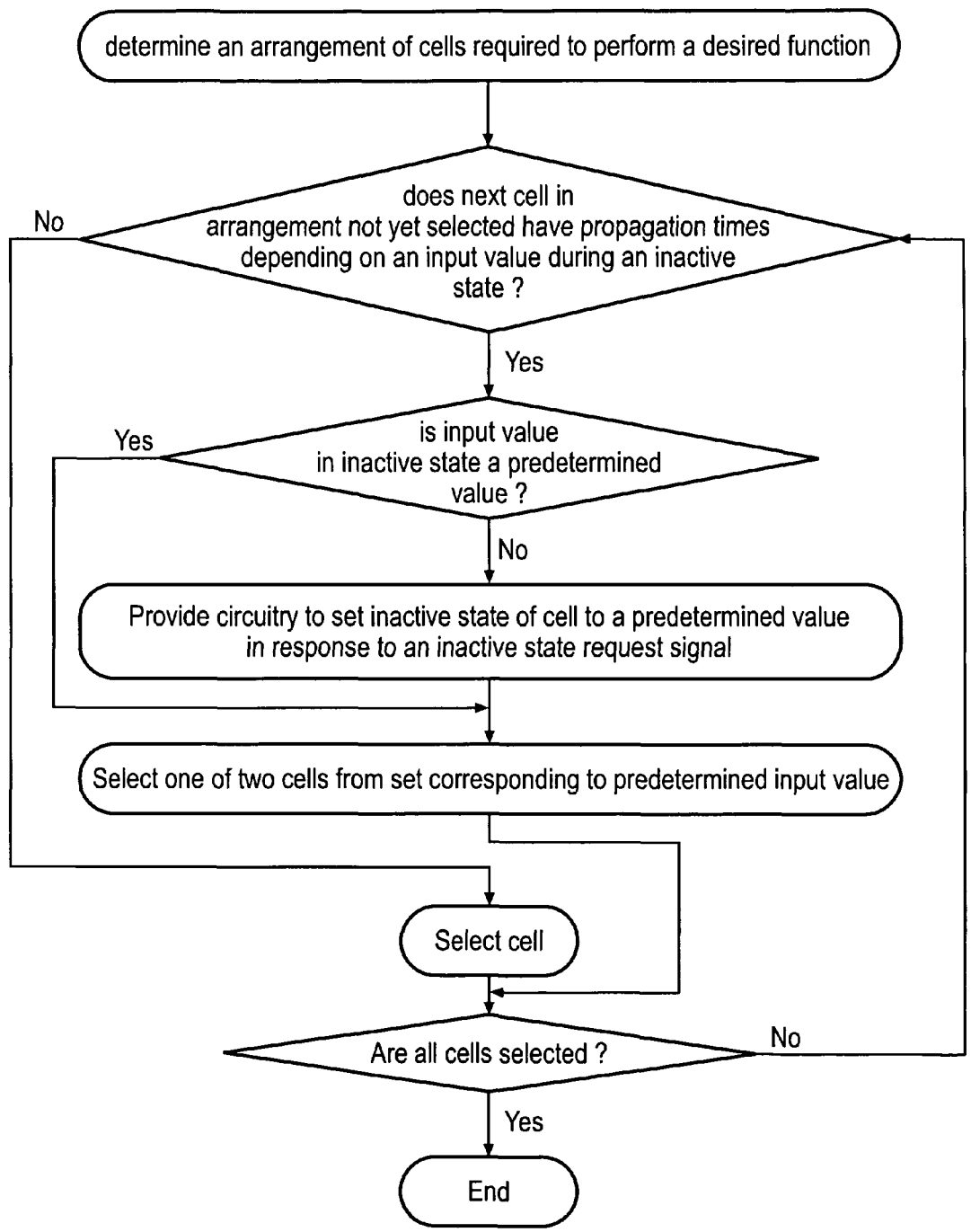
FIG. 8 shows a method of designing a circuit using a set of cells according to an embodiment of the present invention.

FIG. 8 shows a flow diagram illustrating a method of designing a circuit using standard cells according to an embodiment of the present invention. Initially an arrangement of cells required to perform a desired function is determined. It is then determined if the selected cells have propagation times that depend on an input value during an inactive state. If they do then it is determined if the input value in the inactive state has a known predetermined value. If it doesn't then circuitry is provided to set the inactive state of the cell to a predetermined value in response to an inactive state request signal using circuitry such as is illustrated in FIG. 7. Following this, or if the input value in the inactive state did have a known predetermined value owing to the circuit design then the appropriate cell that corresponds to a cell designed to operate with this predetermined input value is selected. In this way, a circuit is designed using two cells having different β ratios that perform the same function, the particular cell being selected depending on the input value to the cell during its inactive state.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A set of two cells for performing a same logical function, each of said two cells comprising a semiconductor inverting device, said semiconductor inverting device comprising at least one NMOS transistor and at least one PMOS transistor;
   a first of said two cells configured to operate with an input of zero during an inactive period where said cell does not change state;
   a second of said two cells configured to operate with an input of one during an inactive period where said cell does not change state;
   said first cell having a first ratio of a width of said at least one PMOS transistor and said at least one NMOS transistor within said semiconductor inverting device; and
   said second cell having a second ratio of a width of said at least one PMOS transistor and said at least one NMOS transistor within said semiconductor inverting device; wherein
   said first ratio is not equal to said second ratio and said first and second ratios are such that a sum of a delay in a rise time of a signal propagated by said first cell and a fall time of a signal propagated by said second cell is substantially equal to a delay in a fall time of a signal propagated by said first cell and a rise time of a signal propagated by said second cell, even when said signal is propagated directly after said inactive period.

2. A set of two cells according to claim 1, wherein said set of two cells are formed using a partially depleted silicon on insulator process.

3. A set of two cells according to claim 1, wherein each of said cells comprises a single stage inverting cell.

4. A set of two cells according to claim 1, wherein said logical function performed by said cells is an inverting function.

5. A set of two cells according to claim 4, wherein said inverting function comprises one of NAND, NOR, AOI, or OAI.

6. A set of two cells according to claim 1, wherein each of said first and second cells comprises at least two inverting semiconductor devices arranged in series;
    an inverting semiconductor device adjacent to an input in said first cell having said first ratio of widths of transistors, and subsequent inverting semiconductor devices each having alternate second and first ratios of widths of transistors; and
    an inverting semiconductor device adjacent to an input in said second cell having said second ratio of widths of transistors, and subsequent inverting semiconductor devices arranged in series each having alternate first and second ratios of widths.

7. A set of two cells according to claim 6, wherein said cells each comprise a dual-stage non-inverting cell comprising a first inverting semiconductor device and a second inverting semiconductor device, said first inverting semiconductor device in said first cell having said first ratio of widths and said second inverting semiconductor device in said first cell having said second ratio of widths, and said first inverting semiconductor device in said second cell having said second ratio of widths and said second inverting semiconductor device in said second cell having said first ratio of widths.

8. A set of two cells according to claim 7, wherein said logical function performed by said cells comprises at least one of buffer, AND, OR, AO and OA.

9. A set of two cells according to claim 1, wherein said cells comprise synchronous cells and said inactive period comprises a period during which said cells are not clocked.

10. A processing apparatus comprising a plurality of cells, said plurality of cells comprising at least one of said set of two cells according to claim 1 arranged in series.

11. A processing apparatus according to claim 10, said processing apparatus comprising a chain of inverting cells, said first cell and said second cell of said set of two cells being arranged alternately within said chain.

12. A processing apparatus according to claim 10, further comprising circuitry responsive to a signal indicating a start of an inactive period for said set of cells to supply a zero to said first cell of said set of cells and a one to said second cell of said set of two cells.

13. A processing apparatus according to claim 12, wherein said signal comprises at least one of a reset signal, a clock gating signal and a power up signal.

14. A method of designing a circuit using standard cells including said set of two cells according to claim 1, said method comprising the steps of:
    determining an arrangement of said standard cells required to perform a desired function;
    determining, for one of said standard cells selected to perform said logical function of said set of two cells, an input value to said one of said standard cells during an inactive period; and
    selecting said first cell or said second cell in dependence upon said input value, said method steps are implemented on a data processing apparatus.

15. A circuit comprising a plurality of semiconductor inverting devices arranged in series, each of said semiconductor inverting devices comprising at least one NMOS transistor and at least one PMOS transistor; wherein
    alternate ones of said inverting devices in said series comprise transistors having a first ratio of a width of said at least one PMOS transistor and said at least one NMOS transistor; and
    other alternate ones of said inverting devices in said series comprise transistors having a second ratio of a width of said at least one PMOS transistor and said at least one NMOS transistor; wherein
    said first ratio and said second ratio are not equal and wherein said first and second ratios are such that a sum of a delay in a rise time of a signal propagated by one of said inverters and a fall time of a signal propagated by an adjacent inverter is substantially equal to a delay in a rise time of a signal propagated by said one of said inverters and a fall time of a signal propagated by said adjacent inverter, even when said signal is propagated after an inactive period during which said inverters do not change state.

16. A circuit according to claim 15, wherein said semiconductor inverting devices are formed using a partially depleted silicon on insulator process.

17. A method of designing a set of two cells for performing a same logical function, each of said two cells comprising a corresponding semiconductor device formed of partially depleted silicon on insulator, said semiconductor device comprising at least one NMOS transistor and at least one PMOS transistor, said method including the steps of:
    designing a first cell to operate with an input of zero during an inactive period during which said first cell does not change state;
    designing a second cell to operate with an input of one during an inactive period during which said second cell does not change state; and
    determining a ratio of widths of said at least one PMOS transistor and said at least one NMOS transistor within said semiconductor device of said first and second cells that provide a minimum in a difference in the sum of rise time of said first cell and fall time of said second cell and the sum of fall time of said first cell and rise time of said second cell, of a signal propagated by said two cells following an inactive period during which they did not change state, wherein said ratio of widths is different for said two cells and in said steps of designing, said two cells have said determined ratios of widths, said method steps are implemented on a data processing apparatus.

* * * * *